(12) United States Patent
Yoshida et al.

(10) Patent No.: US 7,445,689 B2
(45) Date of Patent: Nov. 4, 2008

(54) SUBSTRATE PROCESSING METHOD AND SUBSTRATE PROCESSING SYSTEM

(75) Inventors: Masahiro Yoshida, Tosu (JP); Yasuhiro Chouno, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/682,005

(22) Filed: Oct. 8, 2003

(65) Prior Publication Data
US 2004/0069226 A1 Apr. 15, 2004

(30) Foreign Application Priority Data
Oct. 9, 2002 (JP) ............................. 2002-296492

(51) Int. Cl.
*C23F 1/00* (2006.01)
*H01L 21/306* (2006.01)
(52) U.S. Cl. ........................ 156/345.24; 156/345.31; 156/345.32; 414/935
(58) Field of Classification Search ............ 156/345.26, 156/345.29, 345.31, 345.32; 118/719; 414/939
See application file for complete search history.

(56) References Cited

U.S. PATENT DOCUMENTS

| 5,281,295 | A | * | 1/1994 | Maeda et al. ............ 156/345.29 |
| 5,436,848 | A | | 7/1995 | Nishida et al. |
| 5,928,389 | A | * | 7/1999 | Jevtic ..................... 29/25.01 |
| 6,065,489 | A | * | 5/2000 | Matsuwaka ............... 137/341 |
| 6,174,366 | B1 | * | 1/2001 | Ihantola ...................... 117/84 |
| 6,630,053 | B2 | * | 10/2003 | Yamagishi et al. ....... 156/345.32 |
| 6,843,882 | B2 | * | 1/2005 | Janakiraman et al. .... 156/345.29 |
| 6,982,006 | B1 | * | 1/2006 | Boyers et al. ................. 134/3 |
| 2003/0230239 | A1 | * | 12/2003 | Shan ........................... 118/715 |

FOREIGN PATENT DOCUMENTS

| JP | 6089934 | 3/1994 |
| JP | 2638668 | 4/1997 |
| JP | 2000-049215 | 2/2000 |

* cited by examiner

*Primary Examiner*—Karla Moore
(74) *Attorney, Agent, or Firm*—Morrison & Foerster LLP

(57) ABSTRACT

The substrate processing system has an ozone generator that generates and supplies an ozone-containing gas to plural or N (N is a natural number not less than 2) ozone process units. The ozone generator has capacity of supplying the first processing fluid to only N–n of the first processing units simultaneously at respective supply rates each in accordance with a demand for appropriately performing the first process in each of the first processing units, where n is a natural number and N–n is not less than 2. A controller that controls a timing of loading of the substrate into the ozone process units by the conveyer so as to avoid a case where more than N–n of the first processing units are simultaneously carrying out the first treatment each using the first processing fluid, where n is a natural number and N–n is not less than 2.

7 Claims, 10 Drawing Sheets

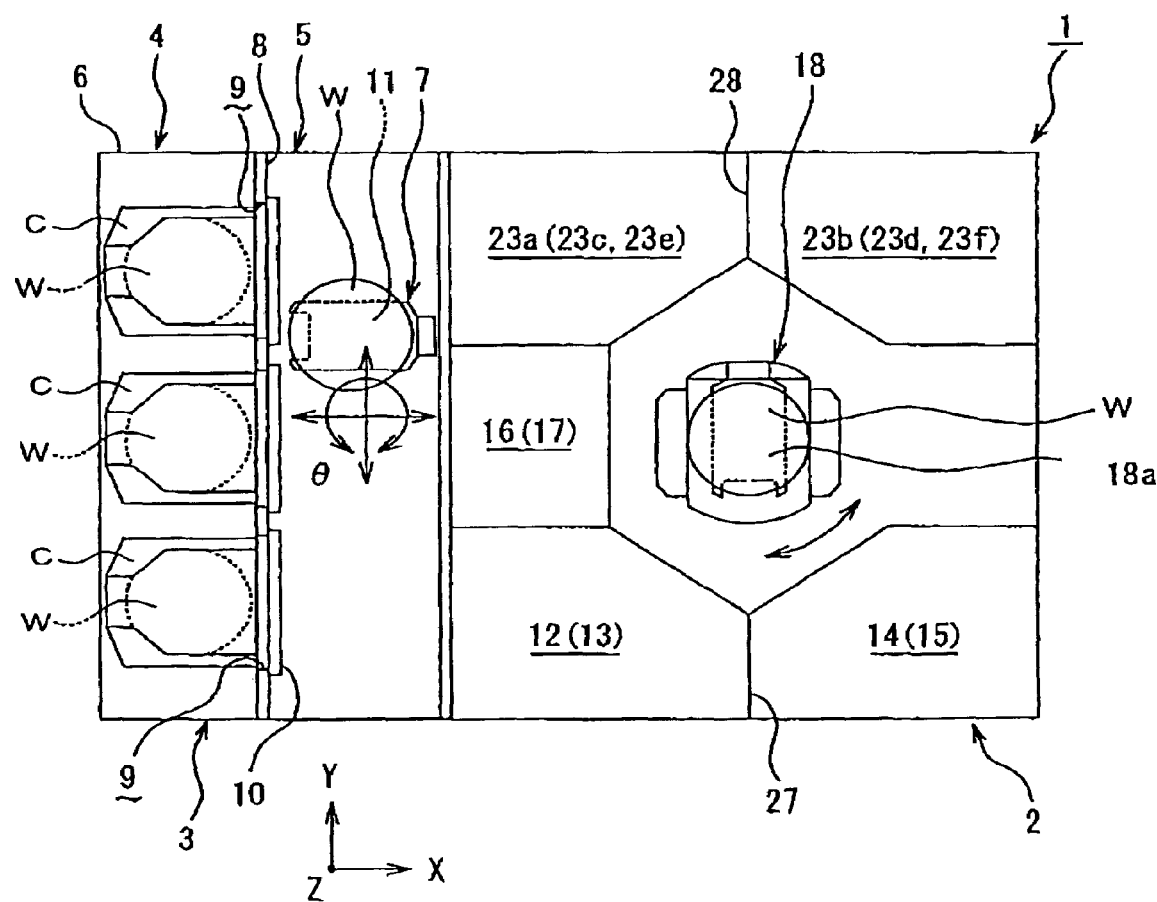
F I G. 1

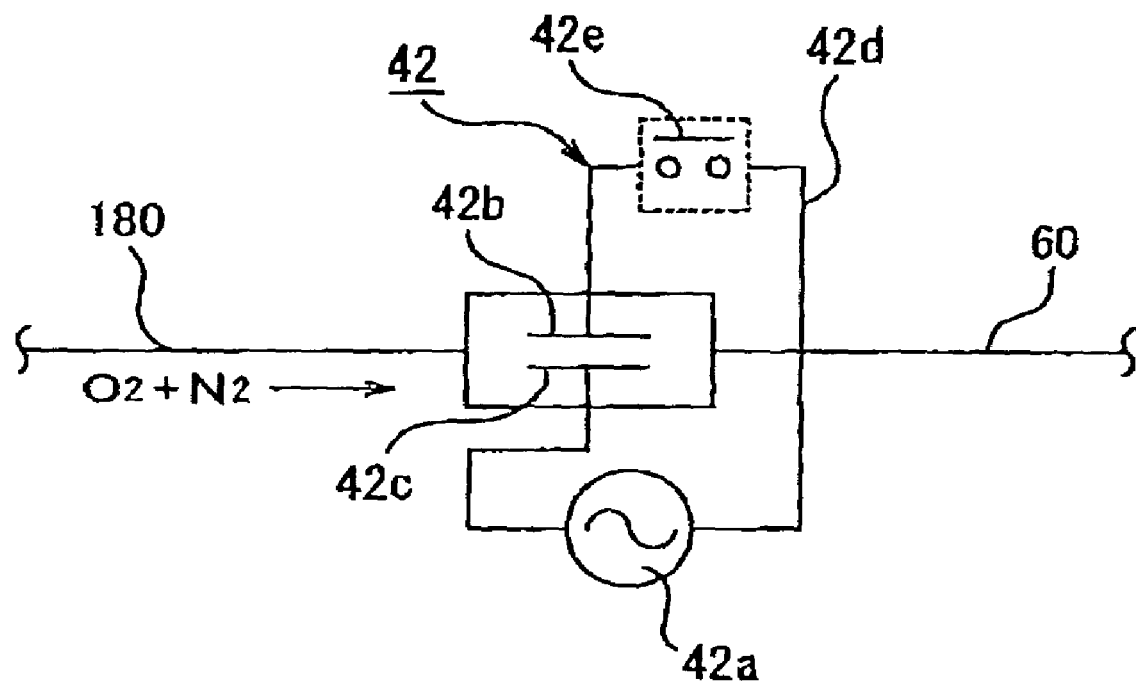
F I G. 4

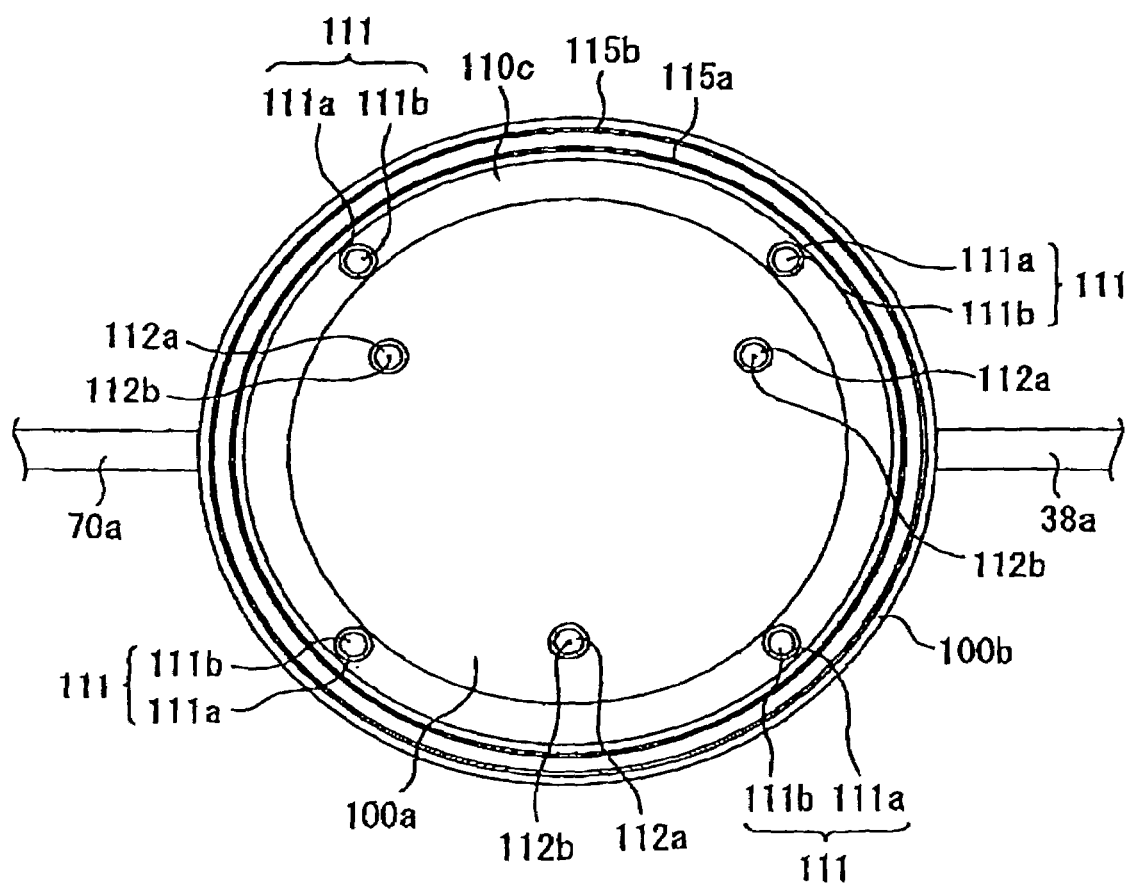
F I G. 7

SUBSTRATE PROCESSING METHOD AND SUBSTRATE PROCESSING SYSTEM

BACKGROUND OF THE INVENTION

1. Field of the Invention

The present invention relates to a substrate processing system and a substrate processing method for processing substrates, such as semiconductor wafers or glass substrates for LCDs (liquid crystal displays).

2. Description of the Related Art

In general, semiconductor device fabricating process include a step of coating a substrate, such as a semiconductor wafer or a LCD substrate, with a resist solution to form a resist film thereon, a step of transferring a circuit pattern onto the resist film by photolithography, a step of exposing the resist film, and a step of removing resist film from the substrate, which are sequentially performed.

A resist removing method by using ozone, which has little problem on disposal, has been recently proposed for environmental reason. The resist removing method includes a step of accommodating a substrate into a processing chamber, a step of feeding ozone and water vapor into the processing chamber with the interior of the chamber being heated and pressurized thereby water-solubilizing the resist film, and a step of washing off the solubilized resist film by using water in a cleaning chamber.

Japanese patent No. 3174409 discloses a method of transporting wafers in a processing system having plural kinds of processing units. In this patent, the work unit time (the required time interval from the start of a certain process until the start of the next process) of the transport apparatus is set based on the maximum value of the processing time of the processing units The transporting of the wafers is performed every work unit time. Japanese patent No. 2638668 also discloses a method of transporting wafers. In this patent, the transporting of the wafers is performed every work unit tie, however, when carrying the substrate into a processing unit that performs a process in a shorter time than the work unit time, the wafer stands-by for a predetermined time.

However, the above transporting procedures are determined based on the processing time and the time point of starting the processing, but not based on the ability of the processing units. Therefore, if the work unit time is determined as mentioned above, it is necessary to increase the number of the processing units in order to improve the throughput of the processing system.

In a processing system having plural ozone processing vessels and a common ozone generator that supplies ozone to the ozone processing vessels, if the ozone processing vessels are used at random, it is possible that all the ozone processing vessels are used at the same time. Thus, the ozone generator must have an ability of supplying ozone to all the ozone processing vessels at the same time. This results in a large-sized ozone generator and thus a large-sized processing system, and a higher cost of the ozone generator.

SUMMARY OF THE INVENTION

The present invention is made in view of the foregoing problems, and it is therefore an object of the present invention is to reduce the size and the cost of the processing fluid supply device, while improving the process efficiency and the throughput of the processing system.

In order to achieve the objective, the present invention provides a substrate processing method, which including the steps of:

(a) providing a substrate processing system including:
  first processing units that number N each adapted to process a substrate by a first treatment with a first processing fluid, where N is a natural number not less than 3;
  at least one second processing unit adapted to process the substrate; and
  a supply device adapted to generate the first processing fluid to be supplied to the first processing units;

(b) processing one of the substrates including the steps of;
  (i) loading said one of the substrates into one of the first processing units;
  (ii) performing the first treatment by using the first processing fluid to said one of the substrates in said one of the first processing units;
  (iii) transferring said one of the substrates, having been processed by said one of the first processing units, to the second processing unit; and
  (iv) performing the second treatment to said one of the substrate by using the second processing unit; and (c) repeating the step (b) plural times to process the substrates, while changing the first processing unit used in the steps (i) and (ii), with at least two of the first processing units simultaneously carrying out the step (ii);

wherein:

the supply device has a capacity of supplying the first processing fluid to only N−n of the first processing units simultaneously at respective supply rates each in accordance with a demand for appropriately performing the first process in each of the first processing units, where n is a natural number and N−n is not less than 2; and in the step (c), timing of starting of the steps (i) is determined so as to avoid a case where more than N−n of the first processing units are simultaneously carrying out the steps (ii) each use the first processing fluid.

Preferably, when the step (b) is repeated, the steps (i) are carried out in the first processing units by turns at T/(N−n) intervals, where T is a time period necessary for carrying out the step (ii).

The present invention also provides a substrate processing system including:

a plurality of first processing units that number N each adapted to process a substrate by a first treatment with a first processing fluid, where N is a natural number not less than 3;

at least one second processing unit adapted to process the substrate; and a supply device adapted to generate the first processing fluid to be supplied to the first processing units, the supply device having a capacity of supplying the first processing fluid to only N−n of the first processing units simultaneously at respective supply rates each complies with a demand for appropriately performing the first process in each of the first processing units, where n is a natural number and N−n is not less than 2; and a substrate conveyer adapted to convey the substrate and to load and unload the substrate into and from the first and second processing units; and a controller that controls a timing of loading of the substrate into the first processing units by the substrate conveyer so as to avoid a case where more than N−n of the first processing units are simultaneously carrying out the first treatment each using the first processing fluid, where n is a natural number and N−n is not less than 2.

Preferably, the controller is configured to control the substrate conveyer so that the conveyer loads the substrates into the first processing units by turns at T/(N−n) intervals, where T is a time period necessary for carrying out the first treatment in each of the first processing units by using the first processing fluid.

The above and other objects, features and advantages of the present invention will become more apparent from the following description taken in connection with the accompanying drawings.

BRIEF DESCRIPTION OF THE DRAWINGS

FIG. 1 is a schematic plan view of a substrate processing system in one embodiment according to the present invention;

FIG. 4 schematically shows a structure of an ozone generator included in the substrate processing system shown in FIG. 1;

FIG. 7 is a top plan view of a vessel body of the ozone processing vessel shown in FIG. 6;

DESCRIPTION OF THE PREFERRED EMBODIMENTS

Figure 2:
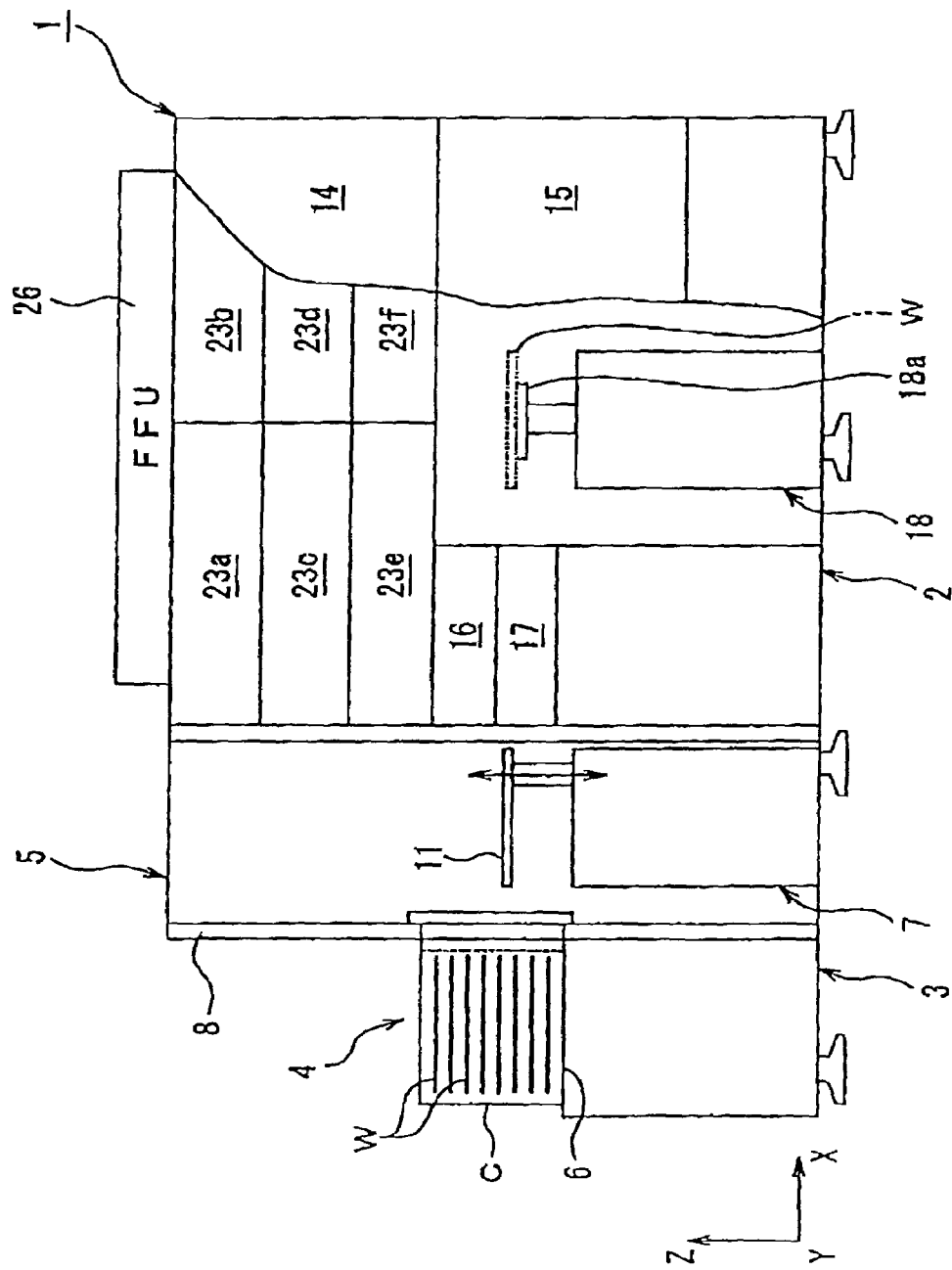
FIG. 2 is a schematic side elevation of the substrate processing system shown in FIG. 1.

The substrate processing system in one embodiment of the present invention will be described with reference to the attached drawings. The description will be made for a processing system configured to perform a resist-solubilizing process and a resist film removing process by way of example.

The substrate processing system 1 includes a processing section 2 for processing semiconductor wafers W (i.e., substrates), and a transfer section 3 for transporting the wafers W to and from the substrate processing section 2.

The transfer section 3 includes an in-and-out (in/out) port 4 provided with a table 6 for supporting wafer carriers C each capable of holding, for example, twenty-five wafers W, therein, and a wafer carrying area provided with a wafer conveyer 7 for transferring wafers W from the wafer carrier C placed on the table 6 to the substrate processing section 2 and vice versa.

The wafer carrier C has one side provided with an opening covered with a cover. The cover of the wafer carrier C is opened to take out wafers W from and to put wafers W into the wafer carrier C. Shelves are supported on the inner surfaces of walls of the wafer carrier C to support wafers W at predetermined intervals. The shelves define, for example, twenty-five slots for accommodating wafers W. One wafer W is inserted in each of the slots with its major surface on which semiconductor devices are to be formed facing up.

A pluraliry of (e.g., three) wafer carriers C can be arranged along the Y-axis in a horizontal plane at predetermined positions on the table 6 of the in/out port 4. The wafer carrier C is placed on the table 6 with its side provided with the cover faced toward a partition wall 8 separating the in/out port 4 and the wafer carrying area 5. Windows 9 are formed in the partition wall 8 at positions corresponding to the positions where the wafer carriers C are placed on the table 6. Shutters (not shown) are installed on the side of the wafer carrying area 5 with respect to the windows 9, and the shutters are operated by shutter operating mechanisms 10 to open and close the windows 9.

The wafer conveyer 7 placed in the wafer carrying area 5 is horizontally movable along the Y-axis, is vertically movable along the Z-axis, and is turnable in the θ-direction in a horizontal plane (i.e., XY-plane). The wafer conveyer 7 has a wafer transfer arm 11 capable of holding and carrying a wafer W. The wafer transfer arm 11 is horizontally movable along the X-axis. Thus, the wafer conveyer 7 is capable of accessing every one of the slots, at different levels, of the wafer carrier C placed on the table 6 and each of two vertically-arranged wafer relay units 16 and 17, and of transferring the wafer from the in/out port 4 to the processing section 2 and vice versa.

The substrate processing section 2 is provided with: a main wafer conveyer 18; the wafer relay units 16 and 17 for temporarily holding a wafer W when transferring the wafer W between the processing section 2 and the transfer section 3, a plurality of (in the illustrated embodiment, six) ozone process units 23a, 23b, 23c, 23d, 23e and 23f (i.e., first substrate processing units); and a plurality of (in the illustrated embodiment, four) substrate cleaning units 12, 13, 14 and 15 (i.e., second subs processing units).

The processing section 2 is provided with an ozone-containing gas supplying unit (not shown) including an ozone generator 42 that generates ozone-containing gas, i.e., processing gas. The processing section is also provided with a chemical liquid storage unit (not shown) storing a processing liquid to be supplied to the substrate cleaning units 12 to 15. A fan filter unit (FFU) 26 is installed on the top wall of the substrate processing section 2 to supply clean air to those units and the main wafer conveyer 18.

Part of clean air blown downward by the FFU 26 flows through the wafer relay units 16 and 17 and a space extending over the wafer relay units 16 and 17 into the wafer carrying area 5. Thus, contaminants, such as particles, are prevented from migrating from the wafer carrying area 5 into the processing section 2 to keep the interior of the processing section 2 clean.

The wafer relay units 16 and 17 hold temporarily a wafer W received from the wafer conveyer 7 and a wafer to be delivered to the wafer conveyer 7. The wafer relay units 16 and 17 are stacked vertically The upper wafer relay unit 16 may be used when transferring a wafer W from the processing section 2 to the in/out port 4, and the lower wafer relay unit 17 may be used when transferring a wafer W from the in/out port 4 to the processing section 2.

The main wafer conveyer 18 is has a base movable in directions parallel to the X-axis and the Z-axis and is turnable in the θ-direction in an XY-plane. The main wafer conveyer 18 has a wafer carrying arm 18a mounted to the base of the main wafer conveyer 18 and capable of holding a wafer W. The carrying arm 18a is capable of moving in directions parallel to the Y-axis when the base of the wafer conveyer 18 is in an angular position shown in FIG. 1. Thus, the main wafer conveyer 18 is able to access the wafer relay units 16 and 17, the substrate cleaning units 12 to 15 and the ozone process units 23a to 23f. The main wafer conveyer 18 may be provided with two or more wafer carrying arms 18a.

Each of the substrate cleaning units 12 to 15 is adapted to perform a cleaning process and a drying process to clean and dry the wafer W, having been processed by the resist-solubilizing process, by the ozone process units 23a to 23f in order to remove the solubilized resist films from the wafers W. Each of the substrate cleaning units 12 to 15 is also adapted to perform a chemical cleaning process and a drying process, which are performed after removal of the solubilized resist films.

The wafer cleaning units 12 to 15 are substantially similar in construction, except that the two wafer cleaning units 12 and 13, and the two wafer cleaning units 14 and 15 are symmetrical with respect to a wall 27 separating the units 12 to 15 two by two.

The ozone process units 23a to 23f perform the resist-solubilizing process for making resist films formed on the surfaces of wafers W water-soluble. As shown in FIG. 2, the ozone process units 23a to 23f are stacked in two stacks; the ozone process units 23e, 23c and 23a are stacked up in that order in the left stack, and the ozone process units 23f, 23d and 23b are stacked up in that order in the right stack. The ozone process units 23a to 23f are virtually similar in construction, except that the units 23a, 23c and 23e in the left stack and the units 23b, 23d and 23f in the right stack are symmetrical, respectively, with respect to a wall 28 separating the right and the left stack.

Figure 5:
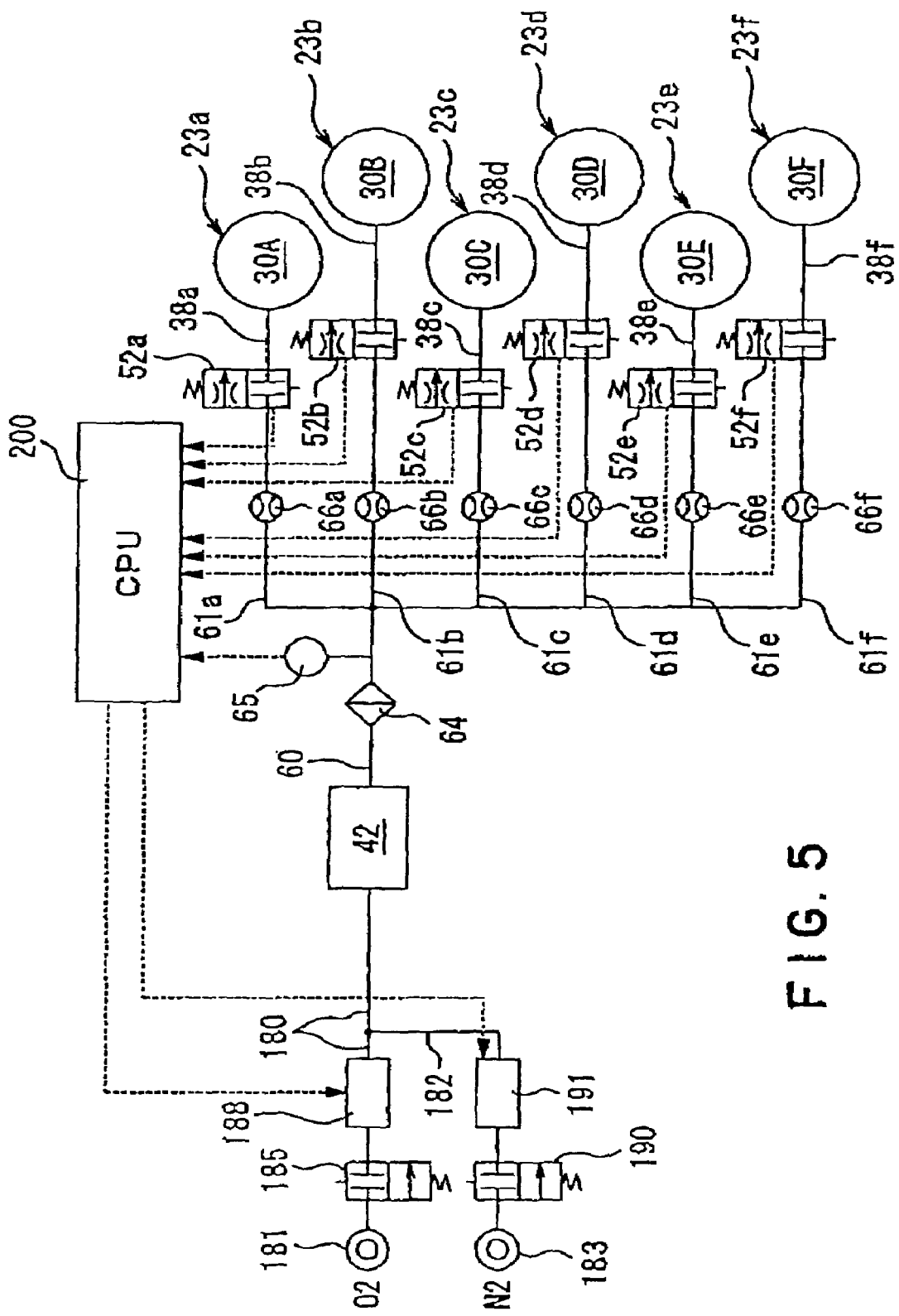
FIG. 5 is a detailed piping diagram of a piping system relating to an ozone supply, which is extracted from the entire piping system of the processing system shown in FIG. 3.

The ozone process units 23a thru 23f are provided with processing vessels 30A and 30F, respectively (see FIG. 5). Each of the processing vessels 30A thru 30B is adapted to hold a wafer W therein.

Figure 3:
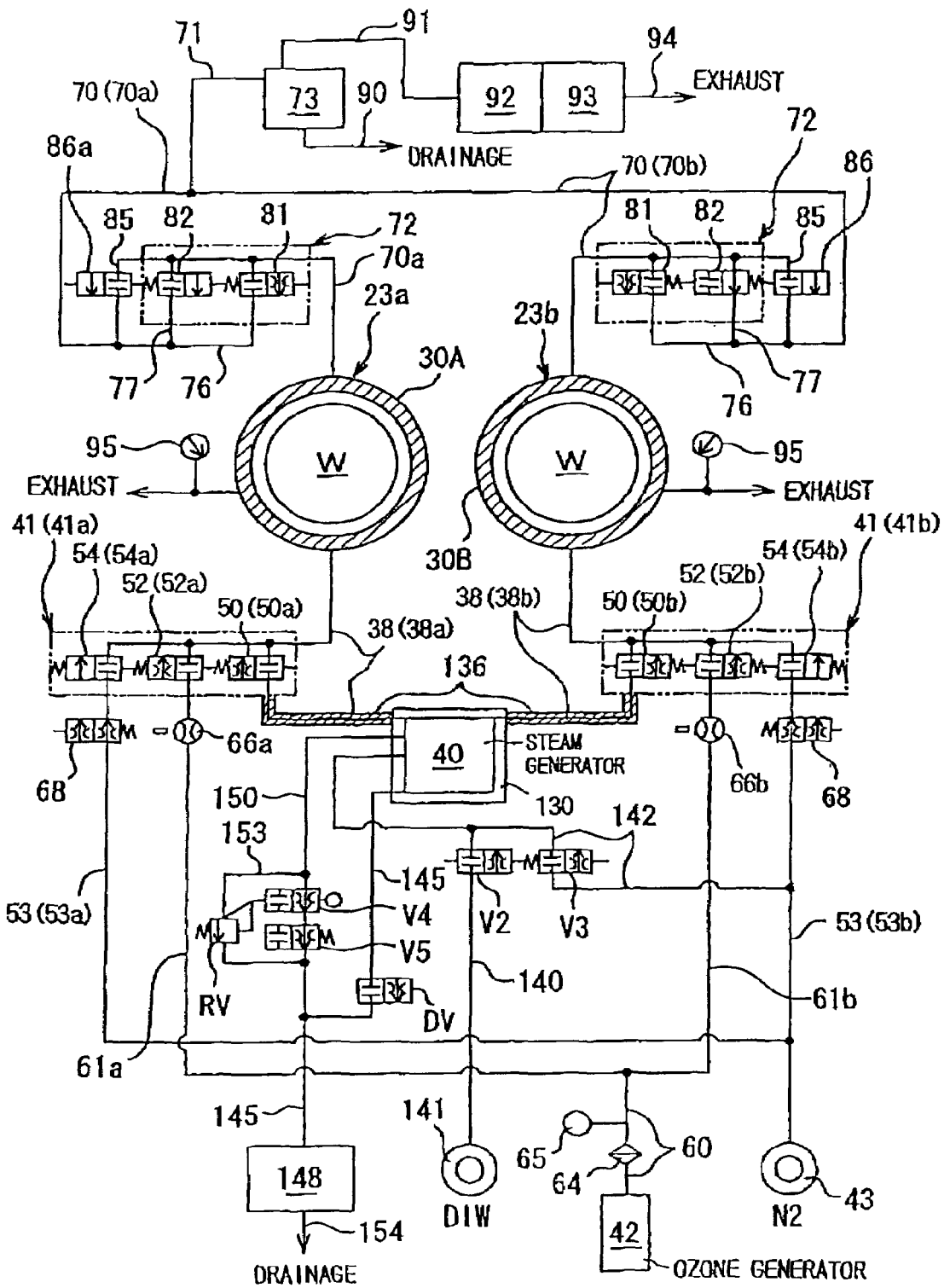
FIG. 3 is a piping diagram of a piping system, relating to only two of processing units, included in the substrate processing system shown in FIG. 1.

FIG. 3 shows the piping system relating to the ozone process units 23a and 23b, which is extracted from the entire piping system for the ozone process units 23a thru 23f. A steam generator 42 is connected to the processing vessels 30A thru 30F through steam supply pipes 38 (only two 38a and 39b of them for the processing vessels 30A and 30B are shown in FIG. 3), (hereinafter referred to as "main supply pipe"), respectively, in order to supply water vapor, i.e., a solvent vapor into the processing vessels 30A thru 30F. Note that the term "solvent vapor" means a vapor of a liquid (e.g., pure water) in which a processing gas (e.g., ozone) is dissolved.

The substrate processing system has only one ozone generator 42, i.e., processing gas source. The ozone generator 42 and a nitrogen gas source 43 are connected to the main supply pipes 38a thru 38f through supply selectors 41 (only two 41a and 41b of them for the processing vessels 30A and 30B are shown in FIG. 3), respectively. Each of the supply selectors 41 include a flow regulating valve 50, a flow regulating valve 52, and a stop valve 54. The flow regulating valve 50 is capable of connecting and disconnecting the corresponding processing vessel 30A thru 30F to and from the steam generator 40, and also capable of regulating the flow rate of steam to be supplied to the corresponding processing vessel 30A thru 30F from the steam generator 40. The flow regulating valve 52 is capable of connecting and disconnecting the corresponding processing vessel 30A thru 30F to and from the ozone generator 42, and also capable of regulating the flow rate of the ozone-containing gas to be supplied to the corresponding processing vessel 30A thru 30F from the ozone generator 42. The stop valve 54 is capable of connecting and disconnecting the processing vessel 30A thru 30F to and from a nitrogen gas source 43.

As shown in FIG. 4, the ozone generator has a pair of electrodes 42b and 42c electrically connected to a high-frequency power supply 42a. The ozone generator generates an ozone-containing gas by applying electric discharge, caused by application of high-frequency voltage across the electrodes 42b and 42c, to an oxygen-containing gas flowing through a space between the electrodes 42b and 42c. A switch 42e is provided in an electric circuit 42d connecting the power supply 42a and the electrodes 42b and 42c. The switch 42e is controlled by a control signal sent from a CPU 200 (i.e., a controller), which will be described later.

It should be noted that the ozone generator 42 need not have capacity of generating the ozone-containing gas at a generating rate which complies with an ozone-containing gas demand for performing the ozone process (i.e., resist-solubilizing process) in all the ozone process units 23a thru 23f at the same time. By virtue of specific operation of the ozone process units 23a thru 23f according to the present invention, the ozone generator 42 should generate an ozone-containing gas at a generating rate which complies with an ozone-containing gas demand for concurrently performing the ozone process in only a predetermined number of the ozone process units (e.g., four ozone process units) which is less than the total number of the ozone process units (in the illustrated embodiment, six) connected to one ozone generator 42.

FIG. 5 is a detailed piping diagram of a piping system relating to an ozone supply, which is extracted from the entire piping system of the processing system shown in FIG. 3. Connected to the ozone generator 42 is an ozone-containing gas supply main pipe 60, which is divided into six ozone-containing gas supply branch pipes 61a, 61b, 61c, 61d, 61e and 61f. The branch pipes 61a thru 61f are connected to the main supply pipes 38a, 38b, 38c, 38d, 38e and 38f through the flow regulating valves 52a, 52b, 52c, 52d, 52e and 52f, respectively. Thus, the main pipe 60, the branch pipes 61a thru 61f and the main supply pipes 38a thru 38f constitute ozone-containing gas supply lines that carry an ozone-containing gas generated by the ozone generator 42 to the processing vessels 30A thru 30F, respectively. A filter 64 and an ozone concentration measuring device 65 for measuring the ozone concentration of the ozone-containing gas produced by the ozone generator 42 are placed in that order from the side of the ozone generator 42 in the ozone-containing gas supply main pipe 60. Flow meters 66a, 66b, 66c, 66d, 66e and 66f and the flow regulating valves 52a thru 52f are placed in that order from upstream side of the ozone-containing gas supply branch pipes 61a thru 61f, respectively. The flow meters 66a thru 66f measure the flow rates of the ozone-containing gas being supplied to the processing vessels 30A thru 30F, respectively.

The respective flow regulating characteristics of the flow regulating valves 52a thru 52f are adjusted beforehand such that, when two or more of the processing vessels 30A thru 30F are supplied with the ozone-containing gas, the flow rates measured by the flow meters (66a thru 66f) corresponding to the processing vessels being supplied with the ozone-containing gas are equal.

In the event that the flow regulating valves 52a and 52b are opened, the ozone-containing gas carried by the ozone-containing gas supply main pipe 60 is distributed equally to the branch pipes 61a and 61b, flows at the equal flow rates into the processing vessels 30A and 30B. Supposing that the ozone-containing gas supplied into the ozone-containing gas supply main pipe 60 at a flow rate of about 8 l/min, the ozone-containing gas flows through each of the branch pipes 61a and 61b at a flow rate about 4 l/min.

Referring to FIG. 3 again, connected to the nitrogen gas source 43 is a nitrogen gas supply pipe, which is divided into two nitrogen gas supply branch pipes 53 (only two 53a and 53b of them for the processing vessels 30A and 30B are shown in FIG. 3). The branch pipes 53 are connected respectively to the main supply pipes 38, through flow selector valves 68 and the stop valves 54 of the supply selectors 41, respectively, in that order from the side of the nitrogen gas source 43. Each of the flow selector valves 68 has a high-flow position and a low-flow position.

Nitrogen gas can be supplied, from the nitrogen gas source 43 through the nitrogen gas supply branch pipes 53 and the main supply pipes 38, into the processing vessels 30A thru 30F at equal flow rates, if the positions (high-flow position or low-flow position) of the flow selector valves 68 are the same.

The flow regulating characteristics of the flow regulating valves 50 can be adjusted such that steam generated by the steam generator 40 is supplied through the main supply pipes 38a thru 38f into the processing vessels 30A thru 30F at equal flow rates.

Discharge lines will be described with reference to FIG. 3. Discharge pipes 70 (only two 70a and 70b of them for the processing vessels 30A and 30B are shown in FIG. 3) are connected to parts of the processing vessels 30A thru 30F respectively diametrically opposite to parts of the processing vessels 30A thru 30F to which the main supply pipes 38 are connected. The discharge pipes 70 are joined to a discharge pipe 71 connected to a mist trap 71. Discharge selectors 72 (only two of them for the processing vessels 30A and 30B as shown in FIG. 3) serving as pressure regulators for the processing vessels 30A thru 30F are provided in the discharge pipes 70, respectively.

Each of the discharge pipes 70 is divided into three branch pipes 76, 77 and 85. The branch pipe 76 is provided with a first switch valve 81. The branch pipe 77 is provided with a second switch valve 82. The branch pipe 85 is provided with a third switch valve 136. The first switch valve 81 has a restrictor therein and allows a fluid to flow therethrough at a relatively low flow rate, when opened. The second switch valve 82 allows a fluid to flow therethrough at a relatively high flow rate, when opened. Normally, the third switch valve 86 is closed. The third switch valve 86 opens in a state of emergency, such as a state where the internal pressure of the processing vessel (30A thru 30F) becomes excessively high. The downstream ends of the branch pipes 76, 77 and 85 are joined together to be a single discharge pipe 70 again. Each of the discharge selectors 72 are composed of the branch pipes 76 and 77 and the first and the second switch valves 81 and 82.

The mist trap 71 cools a processing fluid discharged from the processing vessels 30A thru 30F, separates the liquid contained in the discharged processing fluid from the ozone-containing gas contained in the discharged processing fluid, and drains the liquid through a drain pipe 90. A discharge pipe 91 carries the ozone-containing gas thus extracted from the discharged processing fluid to an ozone killer 92. The ozone killer 92 decomposes ozone contained in the ozone-containing gas into oxygen by thermal decomposition, cools the oxygen and discharges the cooled oxygen through a discharge pipe 94.

As mentioned above, the flow regulating valves 50 regulate the flow rates of steam supplied to the processing vessels 30A thru 30F, respectively. The flow regulating valves 52a thru 52f regulates the flow rates of the ozone-containing gas supplied to the processing vessels 30A thru 30F, respectively. The discharge selectors 72 regulate the discharge rates of fluids discharged from the processing vessels 30A thru 30F to control the pressures in the processing vessels 30A thru 30F, respectively.

Leak detectors 95 are connected respectively to the processing vessels 30A thru 30F to monitor the leakage of the processing fluid from the processing vessels 30A thru 30F.

Figure 6:
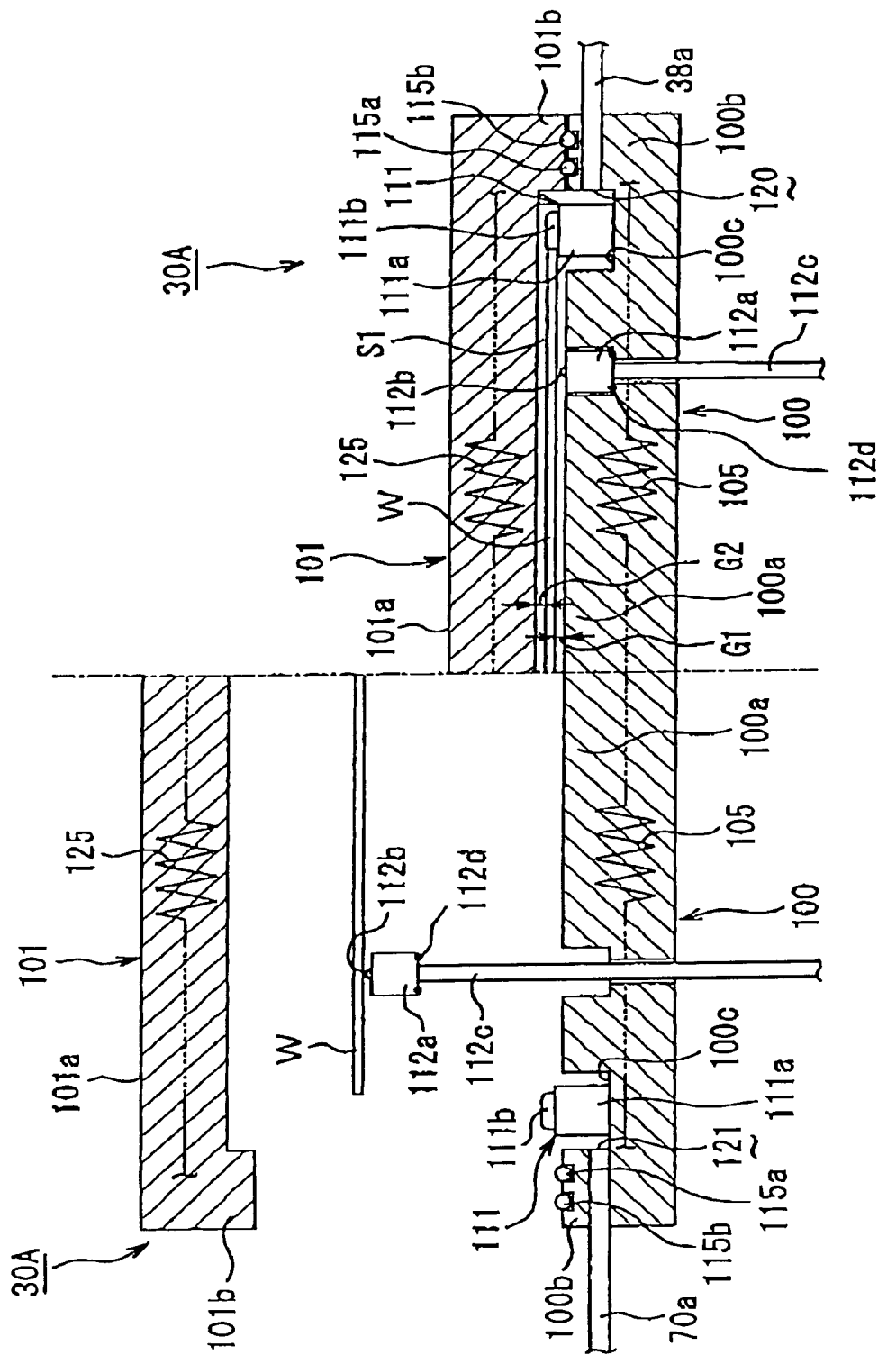
FIG. 6 is a cross-sectional view of an ozone processing vessel included in the substrate processing system shown in FIG. 1.

The processing vessels 30A thru 30F are the same in construction and hence only the processing vessel 30A will be described by way of example. Referring to FIG. 6, the processing vessel 30A has, as principal components, a vessel body 100, and a cover 101 that covers the vessel body 100 to define a processing space S1 between the vessel body 100 and the cover 101.

Referring to FIGS. 6 and 7, the vessel body 100 has a disc-shaped base 10a, an annular circumferential wall 100b rising from a peripheral part of the base 100a to define an annular groove 100c between the base 100a and the wall 100b.

Wafer lifters 112 are arranged in at three positions on a circumference spaced at regular angular intervals. Each of the wafer lifters 112 has a head 112a, a support pin 112b arranged on the top face of the head 112a, and a rod 111c extending downwards from the bottom of the head 112a. The wafer W is placed on the support 30, pins 112b when the wafer lifters 112 lift the wafer W.

The wafer lifters 112 moves in a vertical direction by means of elevating mechanism (not shown) connected to the rods 111c. An O-ring is attached to the bottom of the head 112a to seal gaps between the head 112a and the base 100a in order to seal the processing space S1 when the resist-solubilizing process (ozone process) is being carried out. When the lifters 112 are raised as shown on the left side of FIG. 6, the wafer W can be transferred from the main wafer conveyer 18 to the wafer lifters 112 and vice versa Upon lowering the lifters 112 supporting the wafer W thereon, the wafer W is transferred to support members 111 as shown on the right side of FIG. 6.

A heater 105 is embedded in the base 100a of the vessel body 100 in order to heat or control the atmospheric temperature of the interior space of the processing vessel 30A or the processing space S1.

The support members 111 are placed in the annular groove 100c at regular angular intervals to support the wafer W when the wafer W is subjected to the resist-solubilizing process.

Each of the support members 111 has a base 111a and a positioning projection 111b. When the wafer W is in a processing position as shown on the right side of FIG. 6, the wafer W is placed on the bases 111a of the support members 111 at four positions of the periphery of the back surface of the wafer W so that a gap G1 of about 1 mm is defined between the base 100a and the back surface of the wafer W. The positioning projections 111b prevent the wafer from moving horizontally to keep the wafer stably in place. The support members 111 are formed of a resin, such as a PTFE resin.

Two concentric circular grooves are formed in the upper surface of the circumferential wall 100b. Two O-rings 115a and 115b are fitted in the circular grooves to seal gaps between the upper surface of the circumferential wall 100b and the lower surface of a circumferential wall 101b of the cover 101 so that the processing space S1 may be sealed when the vessel body 100 and the cover 101 are joined together.

A supply port 120 is formed in the circumferential wall 100b of the vessel body 100. The processing fluid is supplied through the supply port 120 into the processing vessel 30A. A discharge port 121 is formed in the circumferential wall 110b at a position diametrically opposite to the supply port 120. The main supply pipe 38a and the discharge pipe 70a are connected, respectively, to the supply port 120 and the discharge port 121.

The supply port 120 and the discharge port 121 open into an upper part and a lower part, respectively, of the annular groove 100c. The arrangement of the ports 120 and 121, in which the supply port 120 is arranged at a level higher than that of the discharge port 121, enables the processing fluid to be supplied smoothly through the supply port 120 into the processing space S1 so that the processing fluid may not stagnate, and also prevents the processing fluid from remaining in the processing vessel 30A when the processing fluid is discharged from the processing vessel 30A. The supply and discharge ports 120 and 121 are connected to a space between the support members 111 to enable the processing fluid to be supplied and discharged smoothly to and from the processing vessel 30A.

The cover 101 has a body 101a internally provided with a heater 125, and a circumferential wall 101b projected downwards from the periphery of the bottom surface of the body 101a. Upon lowering the cover 101 by means of a cylinder mechanism (not shown), the bottom surface of the circumferential wall 101b closely contacts the O-rings 115a and 115b arranged in the top surface of the circumferential wall 100b of the vessel body 100, thereby a gap G2 of about 1 mm is defined between the bottom surface of the body 101a of the cover 101 and the upper surface the wafer W positioned at the processing position, and the processing vessel 30A is sealed, as shown on the right side of FIG. 6.

The steam generator 40 has a tank 130, into which pure water is supplied from a pure water (DEW) source 141. The steam generator 40 generates steam, or a water vapor, by heating the pure water contained in the tank 130 with a heater, not shown. The interior space of the tank 130 is kept at temperature of about 120° C. and in a pressurized state.

Referring to FIG. 3, parts, extending between the steam generator 40 and the supply selector 41a and 41b, of the main supply pipes 38a thru 38f are covered with tubular temperature regulators 136. The regulators 136 regulate the temperature of steam flowing from the steam generator 40 to the supply selector 41a thru 41f.

A flow regulating valve V2 is placed in a pure water supply pipe 140, which carries pure water from the pure water source 141 to the tank 130 of the steam generator 40. A branch pipe 142 branched from the nitrogen gas supply branch pipe 53a connected to the nitrogen gas source 43 is connected to a part, between the flow regulating valve V2 and the steam generator 40, of the pure water supply pipe 140. The branch pipe 142 is provided therein with a flow regulating valve V3. The flow regulating valves V2 and V3 are capable of not only regulating the flow rates of the fluids flowing through the pipes 140 and 142, but also opening and shutting-off the pipes 140 and 142, respectively.

A drain pipe 145 is connected to the tank 130 of the steam generator 40 to drain pure water therefrom. The drain pipe 145 is provided with a drain valve DV interlocked with the flow regulating valve V3 in the branch pipe 142. The drain pipe 145 has a downstream end connected to a mist trap 148. A pressure-relief pipe 150 is connected to the tank 130 of the steam generator 40 to discharge steam therefrom to prevent the internal pressure of the tank of the steam generator 40 from increasing beyond a specified limit. The downstream end of the pressure-relief pipe 150 is connected to a part, on the downstream side of the drain valve DV, of the drain pipe 145. The pressure-relief pipe 150 is provided with a flow regulating valve V4 and a stop valve V5 A branch pipe 153 is connected to the pressure-relief pipe 150. One end the branch pipe 153 is connected to a part, on the upstream side of the flow regulating valve V4, of the pressure-relief pipe 150, and the other end of the branch pipe 153 is connected to a part, on the downstream side of the stop valve V5, of the pressure-relief pipe 150. The branch pipe is provided with a pressure-relief valve RV. The mist trap 148 cools pure water drained through the drain pipe 145 and steam discharged through the pressure-relief pipe 150, and drains therefrom cooled pure water and condensed steam through a drain pipe 154.

The heater of the steam generator 40 is supplied with a fixed electric power in order to maintain the steam generating rate of the steam generator 40 constant, so that the steam generator is operated stably and thus can generate steam having constant quality. As mentioned above, the flow regulating characteristics of the flow regulating valves 50 are adjusted beforehand such that steam generated by the steam generator 40 is supplied to the processing vessels 30A thru 30F at equal flow rates, respectively.

The sum of the flow rates to be supplied to the processing vessels 30A thru 30F is adjusted by discarding a part of the steam generated by the steam generator at a fixed generating rate.

Now, it is supposed that the steam generator generates seven units of steam per unit time.

In the event that steam needs to be supplied to all the processing vessels 30A thru 30F simultaneously, one unit of steam is supplied per unit time to each of the processing vessel 30A thru 30F, and one unit of steam is discharged per unit time from the steam generator 40 through the pressure-relief pipe 150. In this case, the flow regulating valve V4 is adjusted so that one unit of steam flows per unit time through the pressure-relief pipe 150; and all the flow regulating valves 50 and the stop valve V5 of the pressure-relief pipe 150 are opened.

In the event that none of the processing vessels 30A thru 30F needs steam, all the steam generated by the steam generator 40 is discharged through the pressure-relief pipe 150. In this case, the flow regulating valve V4 is adjusted so that seven units of steam flows per unit time through the pressure-relief pipe 150; and all the flow regulating valves 50 are closed; and the stop valve V5 is opened.

In the event that steam needs to be supplied to N (N is a natural number, and is 1 to 5) of the processing vessels 30A thru 30F simultaneously, one unit of steam is supplied per unit time to each of N processing vessels, and 7-N units of steam is discharged per unit time from the steam generator 40 through the pressure-relief pipe 150. In this case, the flow regulating valve(s) 50 corresponding to the processing chambers to be supplied with steam are opened, the flow regulating valve V4 is adjusted so that 7-N units of steam flows per unit time through the pressure-relief pipe 150; and the stop valve V5 is opened.

Steam discharged from the steam generator 40 through the pressure-relief pipe 150 is carried to the mist trap 148 by the drain pipe 145. The pressure-relief valve RV1 opens when the internal pressure of the tank 130 increases beyond a specified limit to discharge steam from the tank 130 through the pressure-relief pipe 150, the branch pipe 153, the pressure-relief pipe 150 and the drain pipe 145.

Referring to FIG. 5 again, an oxygen gas source 181 is connected to the ozone generator 42 by an oxygen gas supply pipe 180. A nitrogen gas supply pipe 182 has one end connected to a nitrogen gas source 183 and the other end connected to the oxygen gas supply pipe 110.

A stop valve 185, and a mass flow controller 188, i.e., a flow regulating device for regulating the flow of oxygen gas to the ozone generator 42 are arranged in that order from the side of the oxygen gas source 181 in the oxygen gas supply pipe 180.

A stop valve 190, and a mass flow controller 191, i.e., a flow regulating device, for regulating the flow of nitrogen gas supplied to the ozone generator 42, are arranged in that order from the side of the nitrogen gas source 183 in the nitrogen gas supply pipe 182.

Oxygen gas supplied from the oxygen gas source 181 and nitrogen gas supplied from the nitrogen gas source 183 flow at flow rates regulated by the mass flow controllers 188 and 191, respectively. Then, the oxygen gas and the nitrogen gas mix to produce an oxygen-containing gas. The oxygen gas supply pipe 180 carries the oxygen-containing gas into the ozone generator 42. The oxygen-containing gas passing between the discharge electrodes 42b and 42c (see FIG. 4) of the ozone generator 42 is subjected to corona discharge, thereby part of oxygen molecules contained in the oxygen-containing gas are ionized to be converted into ozone. The ozone thus produced is ejected together with other gases (such as nitrogen and non-reacted oxygen), as an ozone-containing gas, from the ozone generator 42 into the ozone-containing gas supply pipe 60. In the illustrated embodiment, the mass flow controllers 188 and 191 constitute an oxygen-containing gas flow rate regulator that controls the flow rate of an oxygen-containing gas to be supplied to the ozone generator 42.

According to the operating method as will be mentioned later, the ozone generator 42 needs not have capacity of generating or supplying the ozone-containing gas at a generating or supplying rate that complies with the ozone-containing gas demand for the case where all the processing vessels 30A thru 30F are simultaneously performing the resist-solubilizing process. The capacity of the ozone generator may be less than that as mentioned above, that is, it is sufficient that the ozone generator 42 has capacity of generating or supplying an ozone-containing gas at a generating or supplying rate that complies with the ozone-containing gas demand for the case where a predetermined number (e.g., four) of the processing vessels are simultaneously performing the resist-solubilizing process.

A unit controlling CPU 200, which processes information on processes to be performed by the substrate processing units 23a thru 23f, is capable of detecting the respective states of the flow regulating valves 52a thru 52f, namely, whether or not each of the flow regulating valves 52a thru 52f is opened. The CPU 200 determined the required flow rate of the ozone-containing gas to be supplied to the processing vessel(s) based on the respective states of the flow regulating valves 52a thru 52f, and controls the mass flow controllers 188 and 191 to control respective flow rates of oxygen gas and nitrogen gas supplied to the ozone generator 42 so that the ozone generator 42 generates an ozone-containing gas at a generating rate that complies with the required flow rate. Therefore, the ozone generator 42 generates an ozone-containing gas at a generating rate which is equal to the required flow rate.

In the event that the ozone-containing gas is supplied to only one of the processing vessels 30A thru 30F, the ozone generator 42 generate an ozone-containing gas at a generating rate that complies with the required flow rate of the ozone-containing gas (e.g., 4 l/min) to be supplied to said one of the processing vessels. In this case, the CPU 200 controls the mass flow controllers 188 and 191 to control the flow rates of oxygen gas and nitrogen gas supplied to the ozone generator 42 so that the ozone generator 42 generates the ozone-containing gas at a generating rate of 4 l/min.

In the event that the ozone-containing gas is simultaneously supplied to N (N is a natural number, and is 2 to 4) of the processing vessels 30A thru 30F, the ozone generator 42 generate an ozone-containing gas at a generating rate that complies with the required flow rate of the ozone-containing gas (e.g., N×4 l/min mentioned above) to be supplied to said N of the processing vessels. In this case, the CPU 200 controls the mass flow controllers 188 and 191 to control respective flow rates of oxygen gas and nitrogen gas supplied to the ozone generator 42 so that the ozone generator 42 generates the ozone-containing gas at a generating rate of N×4 l/min. When N of processing vessels are supplied with the ozone-containing gas, as the flow regulating characteristics of the flow regulating valves 52a thru 52f are adjusted beforehand as previously mentioned, the ozone-containing gas is supplied to the processing vessels at equal flow rates, i.e., 4 l/min, respectively.

The CPU 200 is capable of detecting an ozone concentration of the ozone-containing gas measured by an ozone-concentration measuring device 65 and of controlling the discharge voltage of the ozone generator 42 (i.e., the voltage applied across the electrodes 42b and 42c). The measured ozone concentration is used as a control signal for the feedback control of the discharge voltage of the ozone generator 42. Thus, the ozone concentration of the ozone-containing gas is controlled in a feedback control mode. Consequently, an ozone-containing gas having a stable ozone concentration can be produced by appropriately adjusting the discharge voltage, even if the flow rate of the oxygen-containing gas flowing into the ozone generator 42, the oxygen-nitrogen ratio of the oxygen-containing gas, or pressure in the ozone generator 42 is changed.

The ozone-containing gas of a desired pressure having a stable ozone concentration can be supplied at desired flow rates to the processing vessels 30A and 30F by the aforementioned control operations of the CPU 200. Therefore, wafers W processed by supplying the ozone-containing gas only one of the processing vessels 30A thru 30F, and those processed by supplying the ozone-containing gas simultaneously to some of the processing vessels 30A thru 30F can be subjected to the resist-solubilizing processes of the same process conditions. Thus, the wafers W can be processed with high uniformity.

A method of processing wafers W by the aforementioned substrate processing system 1 will be described. The wafer transfer arm 11 takes out one wafer W at a time from the wafer carrier C placed on the table 6 of the in/out port 4 and carries the wafer W to the wafer relay unit 17. Then, the main wafer conveyer 18 receives the wafer W from the wafer relay unit 17. The main wafer conveyer 18 carries the wafers W one by one successively to the substrate processing units 23a to 23f.

The CPU 200 controls the main wafer conveyer 18 such that the wafer conveyer 18 carries the wafers W one by one successively into the substrate processing units 23a to 23f at T/X intervals, where T is a time required for the process(es) carried out by using ozone (the ozone gas filling process and the resist-solubilizing process, mentioned below), in other words, T is a time period during which an ozone-containing gas is being supplied to the substrate processing unit, and X is the number of the processing units to which the ozone generator 42 is capable of simultaneously supplying the ozone-containing gas at appropriate flow rates. If time T is three minutes and number X is four, the main wafer conveyer 18 loads the wafers W into the processing units 23a thru 23f by turns at forty-five seconds intervals. In view of the throughput of the processing system, T/X is preferably equal to or slightly longer than the time period necessary for the main wafer conveyer 18 to transfer the wafer between the units 23a thru 23f, 12 thru 15, 16 and 17 (see first, third and fifth time sections shown in FIG. 8 described later).

Figure 8:
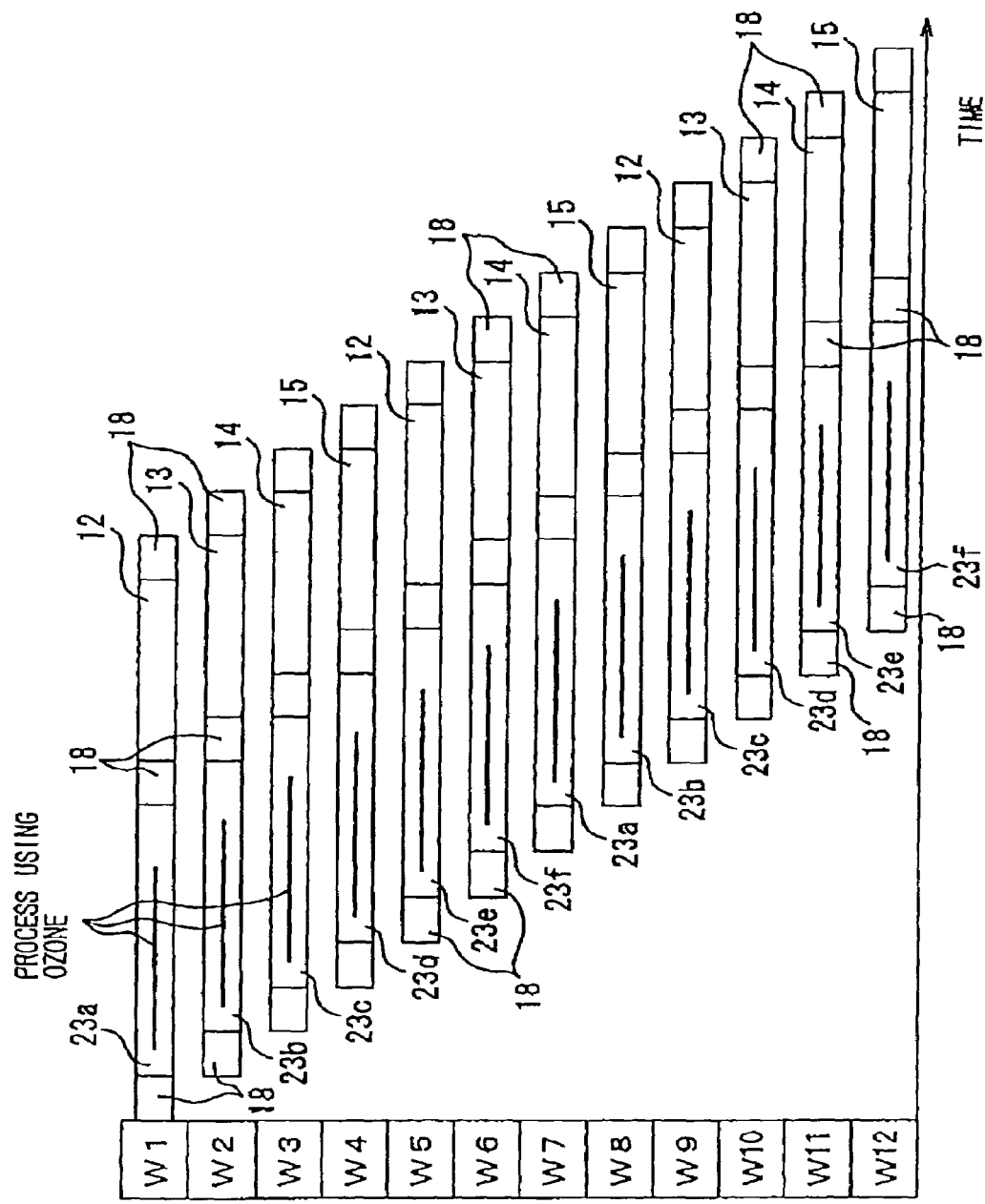
FIG. 8 is a time chart indicating process steps carried out for the wafers.

FIG. 8 is a time chart indicating process steps carried out for plural wafers W1 thru W12. The time chart will be explained for the procedures to be carried out for wafer W1 by way of example. The bar corresponding to the wafer W1 consist of five time sections designated by reference numerals 18 (first time section), 23*a* (second time section), 18 (third time section), 12 (fourth time section) and 18 (fifth time section). Each of the reference numerals shows the device that performs the procedure carried out during each time section. Thus, during the first time section, the main wafer conveyer 18 receives the wafer W1 from the wafer relay unit 17, and conveys the wafer W1 to a position in front of the ozone process unit 23*a*. During the second time section, the arm 18*a* of main wafer conveyer 18 enters into the ozone process unit 23*a* and delivers the wafer W1 to the processing vessel 30A; the wafer W1 is subjected to predetermined processes, which will be mentioned below, in the processing vessel 30A; the wafer W1 is removed from the processing vessel 30A by the main wafer conveyer 18, and the arm 18*a*, of the main wafer conveyer 18 holding the wafer W1 is withdrawn from the ozone process unit 23*a* to locate at a position in front of the ozone process unit 23*a*. During the third time section, the arm 18*a* of the main wafer conveyer 18 holding the wafer W1 is moved from the position in front of the ozone process unit 23*a* to a position in front of the cleaning-and-drying unit 12. During the fourth time section, the arm 18*a* of main wafer conveyer 18 holding the wafer W1 enters into the cleaning-and-drying unit 12 to deliver the wafer W1 to the cleaning-and-drying unit 12; the wafer W1 is subjected to the cleaning and drying processes; the wafer W1 is removed from the cleaning-and-drying unit 12 by the main wafer conveyer 18, and the arm 18*a* of the main wafer conveyer 18 holding the wafer W1 is withdrawn from the cleaning-and-drying unit 12 to locate at a position in front of the cleaning-and-drying unit 12. During the fifth time section, the main wafer conveyer 18 transfers the wafer W1 to the wafer relay unit 18. A solid line ("process using ozone") indicates a time period during which processes using ozone-containing gas (i.e., the ozone-containing gas filling process and the resist-solubilizing process) are carried out. The other time bars corresponding to the wafers W2 to W12 can also be interpreted in the same way as mentioned above.

Referring to FIG. 8, the main wafer conveyer 18 carries a first wafer W1 into the substrate processing unit 23*a* (i.e., ozone process unit).

Referring to FIG. 6, when the first wafer W1 is carried into the processing unit 23*a*, the cover 101 of the processing vessel 30A is separated from the vessel body 100, and the wafer carrying arm 18*a* of the main wafer conveyer 18 (not shown in FIG. 6) is moved to a position below the cover 101, and the wafer lifters 112 rise to receive the first wafer W1(W) from the wafer carrying arm 18*a*. Then, the wafer carrying arm 18*a* is withdrawn from below the wafer W1, and the lifters 112 are lowered, thereby the first wafer W1 is transferred to the support members 111 and is supported on support members 111, so that a gap G1 is defined between the back surface of the first wafer W1 and the upper surface of the base 101*a* of the vessel body 100.

Then, the cover 101 is lowered, thereby the bottom surface of the circumferential wall 101*b* contacts the circumferential wall 100*b* and compresses the O-rings 115*a* and 115*b* to define a sealed processing space in the processing vessel. A gap G2 is defined between the bottom surface of the body 101*a* of the cover 101 and the upper surface the first wafer W1 (Wafer loading process).

After carrying the first wafer W1 into the processing vessel 30A of the processing unit 23*a* (i.e., first processing unit), the main wafer conveyer 18 receives a second wafer W2 from the wafer relay unit 17, and carries the second wafer W2 into the processing vessel 30B of the processing unit 23*b* (i.e., second processing unit) in the same manner as that mentioned above.

In this way, the main wafer conveyer 18 sequentially carries the wafers W into the processing unit 23*a* thru 23*f*. The CPU 200 controls the main wafer conveyer 18 such that conveyer 18 carries the wafer into the processing units at 45-seconds intervals. In other words, the carrying-in of the Nth wafer $W_N$ into the Nth processing unit 23 is performed forty-five seconds (45 sec.) after the carrying-in of the (N−1)th wafer $W_{(N-1)}$ into the (N−1) th processing unit (N=1 to 6).

After the first wafer W1 is carried into the processing vessel 30A and the processing vessel 30A is hermetically closed, the heaters 105 and 125 are energized to heat the interior of the processing vessel 30A and the wafer W to promote the effect of a resist-solubilizing process.

After the interior of the processing vessel 30A and the wafer W have been heated at a predetermined temperature, a signal, representing that the interior of the processing vessel 30A and the wafer W have been heated at the predetermined temperature, is sent to the CPU 200. Then, the CPU 200 sends control signals to devices relating to ozone supply to start supplying the ozone-containing gas into the processing vessel 30A.

The flow rate and ozone concentration of the ozone-containing gas is adjusted by controlling the mass flow controllers 188 and 191 and ozone generator by means of the CPU 200. That is, the flow rate of the oxygen-containing gas (i.e., oxygen gas and nitrogen gas) to be fed to the ozone generator 42 is controlled, by controlling the mass flow controllers 188 and 191 by means of the CPU 200 based on the state (i.e., opened or closed) of the flow regulating valves 52*a* thru 52*f*. Thereby, the generating or supplying rate of the ozone-containing gas of the ozone generator is adjusted to a predetermined value equal to that required by one processing unit (i.e., processing unit 23*a*). The ozone concentration of the ozone-containing gas is controlled in a feedback control mode by the feedback control system consisting of the CPU 200, the ozone generator 42 and the ozone concentration measuring device 65.

The unit controlling CPU 200 gives a control signal to the flow regulating valve 52*a* to open the flow regulating valve 52*a*. Then, an ozone-containing gas having a predetermined ozone concentration is supplied from the ozone generator 42 through the ozone-containing gas supply main pipe 60, the ozone-containing gas supply branch pipe 61*a*, the flow regulating valve 52*a* and the main supply pipe 38*a* into the processing vessel 30A at a flow rate according to the previously-adjusted opening of the flow regulating valve 52*a*. Note that the opening of the flow regulating valves 52*a* thru 52*f* are adjusted beforehand such that, if two or more of the processing vessels (30A thru 30F) are simultaneously supplied with the ozone-containing gas, the ozone-containing gas is supplied into the processing vessels at equal flow rates.

Further, the first switch valve 81*a* of the discharge selector 72 is opened and regulates the flow of the processing fluid discharged from the processing vessel 30A so that the discharged processing fluid flows at a predetermined flow rate through the discharge pipe 70*a*.

Thus, the ozone-containing gas is supplied into the processing vessel 30A while the processing fluid is thus discharged through the discharge pipe 70*a* to create an ozone-containing gas atmosphere of a fixed pressure in the processing vessel 30A. The internal pressure of the processing vessel 30A is kept at a positive pressure higher than the atmospheric pressure by, for example, a gage pressure of about 0.2 MPa. The heaters 105 and 125 keep heating the internal temperature of the processing vessel 30A and the wafer W at the predetermined temperature. The processing fluid is discharged from the processing vessel 30A through the discharge pipe 70*a* into the mist trap 73. Thus, the processing vessel 30A is filled with the ozone-containing gas having the predetermined ozone concentration (Ozone-containing gas filling process).

After filling up the processing vessel 30A with the ozone-containing gas, steam (wafer vapor) is supplied into the processing vessel 30A together with the ozone-containing gas to process the wafer W by the resist-solubilizing process (ozone process). Steam and the ozone-containing gas are supplied simultaneously into the processing vessel 30A with the first switch valve 81 of the discharge selector 72 opened to discharge the processing fluid from the processing vessel 30A. The temperature of steam generated by the steam generator 40 and flowing through the main supply pipe 38*a* is regulated at, for example about 115° C. The steam and the ozone-containing gas are mixed at the supply selector 41*a* to produce a processing fluid, and the processing fluid is supplied into the processing vessel 30A. The internal pressure of the processing vessel 30A is still kept at a positive pressure higher than the atmospheric pressure by, for example, a gage pressure of about 0.2 MPa. The heaters 105 and 125 keep heating the internal temperature of the processing vessel 30A and the wafer W at the predetermined temperature. The processing fluid oxidizes the resist film formed on the surface of the wafer W (Resist-solubilizing process).

The ozone-containing gas is supplied through the main supply pipe 38*a* at the flow rate determined by the low regulating valve 52*a* and steam is supplied through the main supply pipe 38*a* at the flow rate determined by the flow regulating valve 50*a* during the resist water-solubilizing process.

Note that the flow regulating characteristics of the flow regulating valves 52*a* thru 52*f* are adjusted beforehand such that, if two or more of the processing vessels (30A thru 30F) are simultaneously supplied with the ozone-containing gas, the ozone-containing gas is supplied into the processing vessels at equal flow rates. Also note that opening of the flow regulating valves 50 (50*a*, 50*b* . . . ) are adjusted beforehand such that, if two or more of the processing vessels (30A thru 30F) are simultaneously supplied with steam, the steam is supplied into the processing vessels at equal flow rates.

The first switch valve 81 of the discharge selector 72 is opened to control the flow rate of the discharged processing fluid discharged from the processing vessel 30A and flowing through the discharge pipe 70*a* by the first switch valve 81. Thus, the ozone-containing gas and steam are supplied respectively at the predetermined flow rates into the processing vessel 30A while the processing fluid is thus discharged through the discharge pipe 70*a* to create a processing fluid atmosphere of a fixed pressure containing steam and the ozone-containing gas in the processing vessel 30A.

During the resist-solubilizing process is performed, the processing fluid (i.e., the ozone-containing gas and the steam) is continuously supplied through the main supply pipe 38*a* into the processing vessel 30A, and the processing fluid is continuously discharged from the processing vessel 30A through the discharge pipe 70*a*. The processing fluid flows along the upper surface of the wafer W (through the gap G2), along the lower surface of the wafer W (through the gap G1), and along the periphery of the wafer W toward the discharge port 121 connected to the discharge pipe 70*a*.

The supply of the processing fluid through the main supply pipe 38*a* and the discharge of the processing fluid through the discharge pipe 70*a* may be stopped during the resist-solubilizing process to process the resist film by the processing fluid held in the processing vessel 30A.

When the resist-solubilizing process is carried out, the CPU 200 also controls the mass flow controllers 188 and 191 and the ozone generator 42 to control the flow rate and the ozone concentration of the ozone-containing gas to be supplied into the processing vessel 30A. Consequently, the ozone-containing gas having the desired ozone concentration is supplied at the desired flow rate into the processing vessel 30A irrespective of the operating condition of the other processing vessels 30B thru 30F. Supply of the ozone-containing gas at the fixed flow rate keeps the internal pressure of the processing vessel 30A constant. Thus, the internal pressure of the processing vessel 30A, the flow of the processing fluid around the wafer W and the ozone concentration of the processing fluid can be kept at the desired values, respectively, irrespective of the operating condition of the other processing vessel 30B thru 30F. Therefore, wafers W simultaneously subjected to the resist-solubilizing process by the processing vessels 30A and 30B, and wafers W processed by the resist water-solubilizing process in a processing mode in which the processing vessel 30A (or 30B) performs the resist-solubilizing process while the processing vessel 30B (or 30A) performs the wafer loading process are processed equally by the resist-solubilizing process.

After the resist-solubilizing process has been completed, the flow regulating valves 50*a* and 52*b* are closed, the stop valve 54*a* is opened, the flow selector valve 68 is set to the high-flow position to supply nitrogen gas at a high flow rate from the nitrogen gas source 43 into the processing vessel 30A, and the second discharge regulating valve 82 of the discharge selector 72 connected to the discharge pipe 70*a* is opened. Thus, nitrogen gas is supplied from the nitrogen gas source into the processing chamber 30A while the processing fluid is thus discharged from the processing vessel 30A to purge the main supply pipe 38*a*, the processing vessel 30A and the discharge pipe 70*a* by the nitrogen gas. The discharged processing fluid is carried by the discharge pipe 70*a* into the mist trap 73. Thus, the processing fluid containing the ozone-containing gas and steam is discharged from the processing vessel 30A (Discharging process).

Then, the cylinder mechanism (not shown) is actuated to raise the cover 101 so as to separate the cover 101 from the vessel body 100. Then, the wafer lifters 112 are raised by the cylinder mechanism (not shown) to transfer the wafer W from support members 111 to the wafer lifters 112. Then, the carrying arm 18*a* of the main wafer conveyer 18 advances into a space under the wafer w to receive the wafer from the wafer lifters 112, and the main wafer conveyer 18 carries the wafer W out of processing vessel 30A (Wafer carrying-out process).

Figure 9:
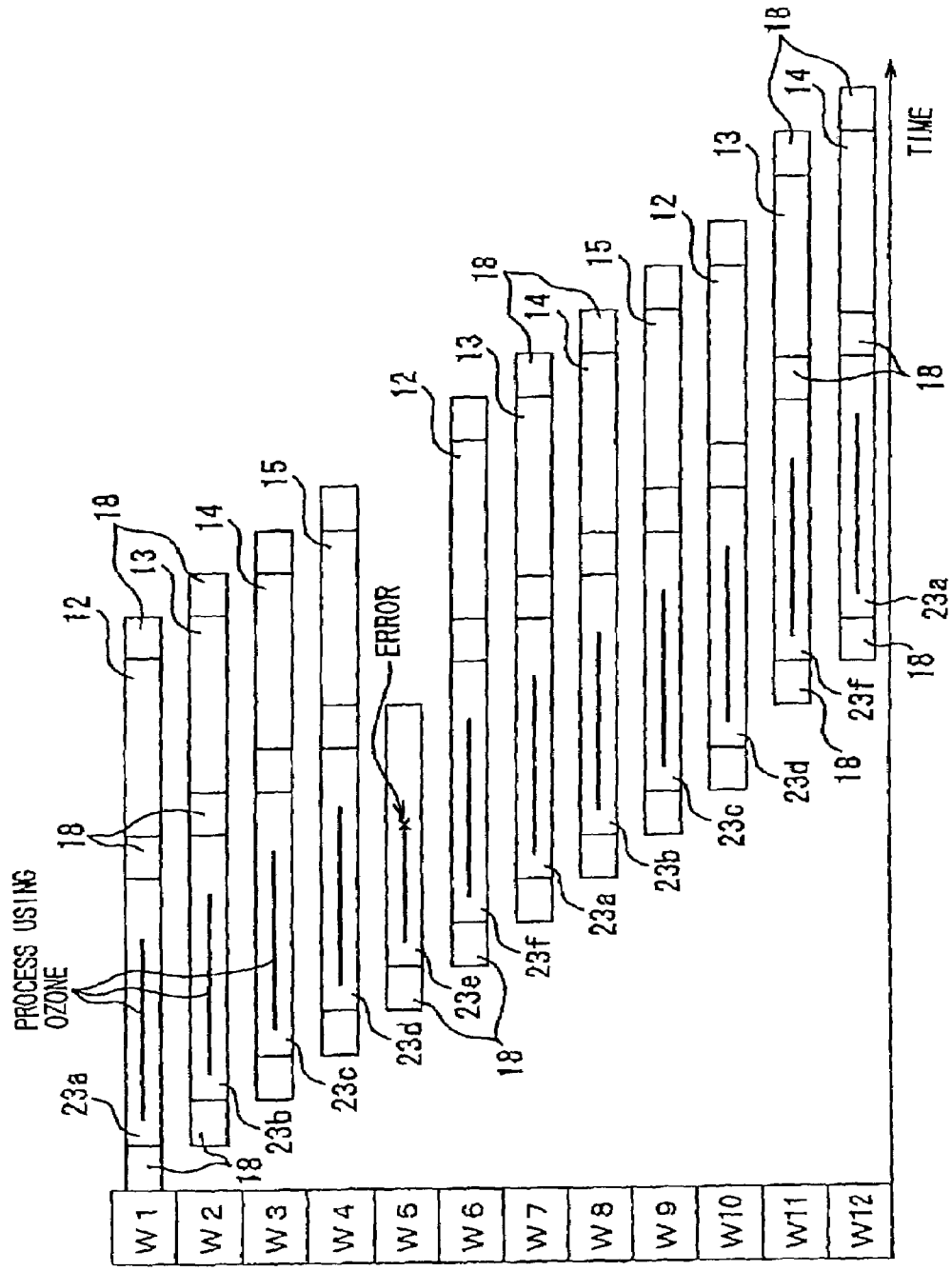
FIG. 9 is a time chart indicating process steps carried out in for the wafers in a case where an accident occurs.

After the predetermined time period has elapsed, the main wafer conveyer 18 a wafer W(W8) into the processing vessel 30A of the processing unit 23*a*, and the wafer W is subjected to the resist-solubilizing process (see FIG. 9).

When a wafer W is subjected to the resist-solubilizing process in any one of the processing units (23*b* thru 23*f*) other than the processing unit 23*a*, the aforementioned procedures are carried out. In the event that two (23*a*, 23*b*) of the processing units 23*a* thru 23*f* simultaneously performs the resist-solubilizing process, the CPU 200 controls the mass flow controllers 188 and 191 so that the generating rate of the ozone-containing gas of the ozone generator 42 is adjusted to a predetermined value equal to that necessary for two processing unit to simultaneously perform the resist-solubilizing process in both the two processing units. In the event that three or four of the processing units 23*a* thru 23*f* simultaneously performs the resist-solubilizing process, the CPU 200 controls the mass flow controllers 188 and 191 so that the generating rate of the ozone-containing gas of the ozone generator 42 is adjusted to a predetermined value equal to that necessary for three or four processing unit to simultaneously perform the resist-solubilizing process in all the three or four processing units.

The wafers W having been subjected to the resist-solubilizing process in the processing units 23a thru 23f are conveyer to any one of the substrate cleaning units 12 thru 15, and are subjected to cleaning and drying processes.

According to the aforementioned embodiment, as the timing of loading of the wafers into the processing vessels is delayed with respect to the capacity of the ozone generator 42 and the time period necessary for the processes using the ozone-containing gas, an ozone generator having relative low ozone generating capacity may be used. This reduces the cost of the ozone generator. In addition, all the processing units 23a thru 23f are operated effectively, resulting in improvement of throughput.

In the event that one or more of the processing units 23a thru 23f is failed, in the event that the main wafer conveyer 18 is stopped temporarily, or in the event that the timing of transfer of the wafers W due to dummy dispensing of a wafer, the CPU 200 controls the main wafer conveyer 18 to correct the timing of loading (carrying-in) of the wafer into the processing units 23a thru 23f, such that four or more of the processing units 23a thru 23f do not process the wafers W simultaneously, in other words, the total flow rate of the ozone-containing gas necessary for the processing units 23a thru 23f does not exceed the capacity of the ozone generator 42.

In the event that, as shown in FIG. 9, any error or abnormality in processing of wafer W5 occurs in the processing unit 23e and the processing of the wafer W5 is stopped to be maintained or repaired, the processing of wafers W3, W4, W6, W7 and W8 respectively in the processing units 23a, 23b, 23c, 23d and 23f now being performed is continued according to predetermined routine. The processing of wafers W9 and W10 scheduled as shown in FIG. 9 is suspended.

Alternatively, the loading of the wafers W9 and W10 into the processing units 23c and 23d may be performed forty-five seconds after the loading of the wafers W8 and W9 into the processing units 23b and 23c, respectively, as scheduled beforehand as shown in FIG. 9. In this case, the loading of wafer W11 into the processing unit 23f forty-five seconds after the loading of wafer W10 into the processing unit 23d is impossible, because, the processing unit 23f is still processing wafer W6. In such a case, the CPU 200 changes the schedule for loading of the wafer W11 such that the wafer W11 is loaded into the processing unit 23f ninety seconds after the loading of the wafer W10 into the processing unit 23d. In this case, the CPU 200 controls the mass flow controllers 188 and 191 to regulate the ozone-containing gas generating rate of the ozone generator 42.

As mentioned above, before completion of the maintenance or repairing of the processing unit 23e, the process schedule may be changed such that: the loading of the wafers W into the processing units 23a thru 23d is performed at forty-five seconds intervals as scheduled beforehand; and the loading of the wafers W into the processing units 23f is performed ninety-seconds after the loading of the wafer W into the processing unit 23d.

Figure 10:
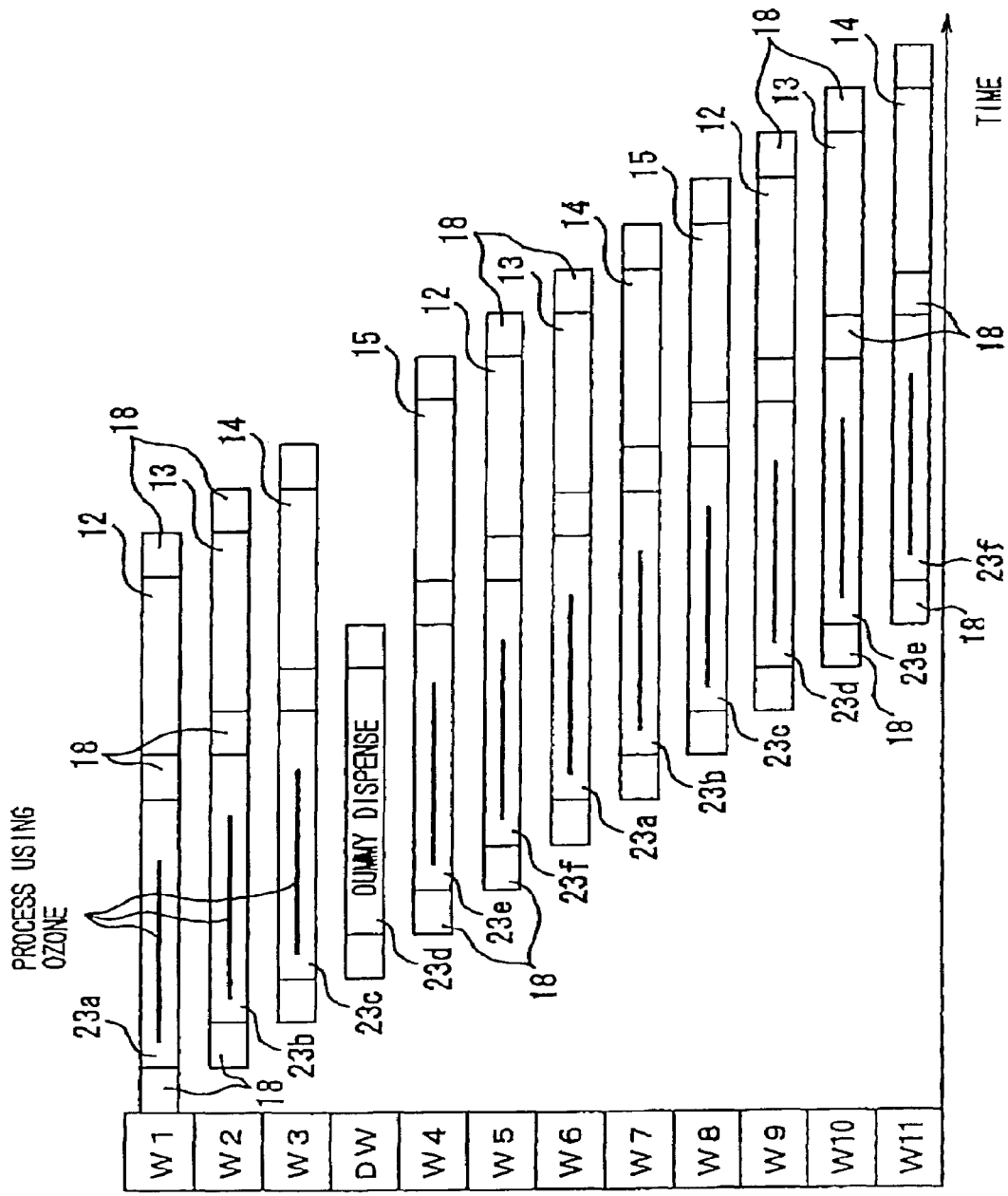
FIG. 10 is a time chart indicating process steps carried out for the wafers in a case where dispense of a dummy wafer is performed.

In the event that, as shown in FIG. 10, a dummy wafer DW is loaded into the processing unit 23d after wafer W3 is loaded into the processing unit 23c (dummy dispense to the processing unit 23d), the CPU 200 controls the main wafer conveyer 18 so that: the loading of the dummy wafer DW is performed forty-five seconds after the loading of the wafer W3 into the processing unit 23c; the loading of wafer W4 into the processing unit 23e is performed forty-five seconds after the loading of the dummy wafer DW into the processing unit 23d. The loadings of wafers W5, W6, W7 . . . are performed every forty-five seconds after the loading of the wafer W4. In the event that the dispense of a dummy wafer DW is performed for a processing unit other than the processing unit 23c, the loading of the wafers W into the processing units 23a thru 23f may be performed in a similar manner.

The present invention is not limited to the aforementioned embodiment. For example, the steam generator 40 may be configured to have capacity of supplying steam to only a predetermined number of the ozone process units 23a thru 23f simultaneously at respective supply rates each complies with a demand for appropriately performing the resist solubilizing-process in each of the first processing units.

Although the invention has been described in its preferred embodiment as applied to processing semiconductor wafers, substrates that can be processed by the present invention is not limited thereto; the present invention is applicable to processing substrates including glass substrates for LCDs, reticle substrates for photomask or the like.

What is claimed is:

1. A substrate processing system comprising:

a plurality of first processing units that number N, each adapted to process a substrate by a first treatment with a first processing fluid, where N is a natural number not less than 3;

at least one second processing unit adapted to process the substrates; and a supply device adapted to generate the first processing fluid to be supplied to the first processing units, the supply device having a capacity of supplying the first processing fluid to only N−n of the first processing units simultaneously at respective supply rates, each supply rate complying with a demand for appropriately performing the first process in each of the N−n first processing units, where n is a natural number and N−n is not less than 2; and a substrate conveyer adapted to convey the substrates and to load and unload the substrates into and from the first and second processing units; and a controller that controls a timing of loading of the substrates into the first processing units by the substrate conveyer so as to avoid a case where more than N−n of the first processing units are simultaneously carrying out the first treatment with each using the first processing fluid, wherein the supply device is configured to generate the first processing fluid by converting at least one source fluid supplied to the supply device, wherein the controller is configured to control the substrate conveyer so that the conveyer loads the substrates into the first processing units by turns at T/(N−n) intervals according to a predetermined loading schedule, where T is a time period necessary for carrying out the first treatment in each of the first processing units by using the first processing fluid, wherein the controller is configured so that if any error or abnormality in the first treatment occurs in one of the first processing units, the controller changes the loading schedule such that the substrate conveyer loads the substrates into the first processing units other than said one of the first processing units after the error or abnormality, and the timing at which the substrate conveyer loads substrates into the first processing units is delayed after the error or abnormality occurs and wherein the controller is configured to change the loading schedule by setting a lengthened interval only between successive loadings of substrates into two of the first processing units, while intervals between loadings of substrates into any two of the first processing units other than said two of the first processing units are kept unchanged.

2. The system according to claim 1, further comprising a flow control device configured to adjust a flow rate of the at least one source fluid supplied to the supply device so that the supply device supplies the first processing fluid at a flow rate corresponding to a sum of the demand for appropriately performing the first process in each of the first processing units performing the first process simultaneously.

3. The system according to claim 1, wherein the supply device is configured to generate the first processing fluid from a first source fluid and a second source fluid.

4. The system according to claim 3, further comprising a first flow control device and a second flow control device configured to adjust a flow rate of the first source fluid and the second source fluid supplied to the supply device, respectively, so that the supply device supplies the first processing fluid at a flow rate corresponding to a sum of the demand for appropriately performing the first process in each of the first processing units performing the first process simultaneously.

5. The system according to claim 3, wherein the supply device is an ozone generator, the first source fluid is oxygen gas, and the second source fluid is nitrogen gas.

6. The system according to claim 1, wherein each of the first processing units is an ozone processing unit configured to process a substrate with a mixed fluid containing the first processing fluid and water vapor, the first processing fluid being ozone gas, and wherein the second processing unit is a cleaning unit configured to clean the substrate having been processed by any one of the first processing unit.

7. The system according to claim 1, wherein said two of the first processing units is a first processing unit to be loaded with a substrate right before said one of the first processing units is loaded with a substrate when all the first processing units are in normal operation, and another first processing unit to be loaded with a substrate right after said one of the first processing units is loaded with a substrate when all the first processing units are in normal operation.

* * * * *